US007954236B2

(12) United States Patent
Lundell et al.

(10) Patent No.: US 7,954,236 B2
(45) Date of Patent: Jun. 7, 2011

(54) METHOD OF ASSEMBLING A SEALED THERMAL INTERFACE

(75) Inventors: Timothy J. Lundell, Long Lake, MN (US); Thomas L. Lundell, Long Lake, MN (US)

(73) Assignee: Lundell Manufacturing Corporation, Plymouth, MN (US)

( * ) Notice: Subject to any disclaimer, the term of this patent is extended or adjusted under 35 U.S.C. 154(b) by 1155 days.

(21) Appl. No.: 11/704,005

(22) Filed: Feb. 8, 2007

(65) Prior Publication Data

US 2008/0190584 A1 Aug. 14, 2008

(51) Int. Cl.
*B21D 53/02* (2006.01)
(52) U.S. Cl. ....... 29/890.03; 165/46; 165/185; 361/704; 361/705
(58) Field of Classification Search ............... 29/890.03; 165/46, 185; 156/285, 286; 361/704, 705
See application file for complete search history.

(56) References Cited

U.S. PATENT DOCUMENTS

| | | |
|---|---|---|
| 3,928,907 A | 12/1975 | Chisholm |
| 4,132,856 A | 1/1979 | Hutchison et al. |
| 4,299,715 A | 11/1981 | Whitfield et al. |
| 4,466,483 A | 8/1984 | Whitfield et al. |
| 4,473,113 A | 9/1984 | Whitfield et al. |
| 4,602,678 A | 7/1986 | Fick |
| 4,606,962 A | 8/1986 | Reylek et al. |
| 4,654,754 A | 3/1987 | Daszkowski |
| 4,685,987 A | 8/1987 | Fick |
| 4,764,845 A | 8/1988 | Artus |
| 4,782,893 A | 11/1988 | Thomas |
| 4,842,911 A | 6/1989 | Fick |
| 4,869,954 A | 9/1989 | Squitieri |
| 4,965,699 A | 10/1990 | Jorden et al. |
| 4,974,119 A | 11/1990 | Martin |
| 4,979,074 A | 12/1990 | Morley et al. |
| 5,060,114 A | 10/1991 | Feinberg et al. |
| 5,137,959 A | 8/1992 | Block et al. |
| 5,151,777 A | 9/1992 | Akin et al. |
| 5,167,851 A | 12/1992 | Jamison et al. |
| 5,194,480 A | 3/1993 | Block et al. |
| 5,205,348 A | 4/1993 | Tousignant et al. |
| 5,213,868 A | 5/1993 | Liberty et al. |
| 5,250,209 A | 10/1993 | Jamison et al. |

(Continued)

OTHER PUBLICATIONS

Fujipoly—Sarcon Thermal Interface Materials; Fujipoly—A ISO9000 Registered Company; (3 pages); (Jan. 18, 2007);http://www.fujipoly.com/products/genProductLine.asp?ProductLine=SarconThermal-Interface-Materials.

(Continued)

*Primary Examiner* — David P Bryant
*Assistant Examiner* — Ryan J Walters
(74) *Attorney, Agent, or Firm* — Patterson Theunte Christensen Pedersen, P.A.

(57) ABSTRACT

A sealed thermal interface component minimizes or eliminates the exudation of fluids, such as silicone oils, while preserving the excellent thermal conductivity of silicon-based thermal pad materials and enhancing the conformability of the component. In preferred embodiments, a foam frame surrounds a plurality of thermal pad portions formed of conformable thermal management material that may exude fluid under elevated temperatures or over time. Film encapsulates the foam-framed thermal pad portions, forming a sealed and partially evacuated thermal interface component. In one embodiment of the invention, the thermal pads are formed of an elastomeric matrix material containing silicone, the foam frame is made of urethane, and the film is made of polyurethane.

5 Claims, 4 Drawing Sheets

U.S. PATENT DOCUMENTS

| | | | |
|---|---|---|---|
| 5,298,791 A | | 3/1994 | Liberty et al. |
| 5,309,320 A | | 5/1994 | Smith |
| 5,321,582 A | | 6/1994 | Casperson |
| 5,359,768 A | | 11/1994 | Haley |
| 5,471,027 A | | 11/1995 | Call et al. |
| 5,510,174 A | | 4/1996 | Litman |
| 5,533,256 A | | 7/1996 | Call et al. |
| 5,545,473 A | | 8/1996 | Ameen et al. |
| 5,679,457 A | | 10/1997 | Bergerson |
| 5,766,740 A | | 6/1998 | Olson |
| 5,790,376 A | * | 8/1998 | Moore .................. 361/700 |
| 5,798,171 A | | 8/1998 | Olson |
| 6,054,198 A | | 4/2000 | Bunyan et al. |
| 6,096,414 A | | 8/2000 | Young |
| 6,397,450 B1 | | 6/2002 | Ozmat |
| 6,946,190 B2 | | 9/2005 | Bunyan |
| 7,004,244 B2 | * | 2/2006 | Rauch ..................... 165/185 |
| 7,063,127 B2 | | 6/2006 | Gelorme et al. |
| 7,137,444 B2 | | 11/2006 | Faybishenko et al. |
| 7,568,255 B1 | * | 8/2009 | Krebs ................... 15/104.93 |
| 7,682,690 B2 | * | 3/2010 | Bunyan et al. ............ 428/323 |

OTHER PUBLICATIONS

The Bergquist Company; Thermal Materials: Thermal Properties and Testing; (Jan. 18, 2007); 3 pages; http://www.bergquistcompany.com/tm-thermal-prop.cfm.

The Bergquist Company; Compressive Modulus of Elasticity for Gap Pad® Materials; (5 pages); Benno Shuhbauer and Kevin Hanson; (May 3, 1999).

The Bergquist Company; Thermal Materials: Sil-Pad Products; (3 pages); http://www.bergquistcompany.com/tm_sil_pad_list.cfm, 2007.

The Bergquist Company; Thermal Materials: Gap-Pad Products; (2 pages); http://www.bergquistcompany.com/tm_gap_pad_list.cfm, 2007.

Dow Corning; Thermal Interface—Pads and Films; Thin Thermal Interface Materials Overview; (Fomerly Known as Heat Path™); http://www.dowcorning.com/content/etronics/etronicspadsfilm/etronics_tcpad_thinov.asp; (2 pages), 2007.

Dow Corning; Product Information; Information about Dow Corning® Brand Thermal Interface Pads and Films; (8 pages), 2003.

Dow Corning; Thermal Interface—Pads and Films; http:www.dowcorning.com/content/etronics/etronicspadsfilm/default.asp; (2 pages, 2007.

Dow Corning; Thermal Interface—Pads and Films; Gap Filler thermal Interface Materials Overview; http://www.dowcorning.com/content/etronicspadsfilm/etronics_tcpad_gapov.asp; (2 pages), 2007.

W. L. Gore & Associates—Electronics Products Division; Gore™ Polarchip™ CP8000 Thermal Interface Material Brochure; © 2003 W.L. Gore & Associates; (1 page), 2007.

Gore Creative Technologies Worldwide; CP8000 Thermal Interface Material Product Technical Details—POLARCHIP CP8000 Thermal Interface Material Properties; http://www.gore.com/en_xx/products/electronic/speciality/cp8000_therm_int_mtrl_tech+dtls.html; (3 pages), 2007.

Core Creative Technologies Worldwide; CP6000 Thermal Interface Material Product Technical Details;http://www.gore.com/en_xx/products/electronic/speciality/m20_therm_int_mtrl_prod_tech_dils.html; (3 pages), 2007.

Gore Creative Technologies Worldwide; Thermal Interface Materials; CP6000 and CP8000; http://www.gore.com/en_xx/products/electronic/speciality/thermal_interface_materials.html; (2 pages), 2007.

Laird Technologies; T-flex™ 600 Series Thermal Gap Filler; Engineered emi, antenna and Thermal applications; www.lairdtech.com; (3 pages), 2007.

Laird Technologies; Corporate Overview Brochure; http://ww.lairdtech.com/pages/catalogs/thermal.asp; (17 pages), 2007.

3M Thermal Management Solutions for Electronics Brochure; (6 pages), 2005.

3M Thermally conductive Interface Pad 5591s; Technical Data; Aug. 2006; (4 pages).

3M Thermally Conductive Interface Pad 5592/5592s; Aug. 2006; (4 pages).

3M Thermally Conductive Interface Pad 5595/5595s; Aug. 2006; (4 pages).

* cited by examiner

METHOD OF ASSEMBLING A SEALED THERMAL INTERFACE

BACKGROUND OF THE INVENTION

This invention relates to thermal management materials that conduct heat from a heat source to a heat-sinking component and, more particularly, components that interface between a heat source and a heat switch.

During operation, IC devices produce heat. Efficient cooling systems are sometimes necessary to prevent the failure of IC devices due to this heat. Certain types of cooling systems work by transferring heat from the surface of a heat source to a heat-sinking component that dissipates the heat. Heat sinking components typically are metal, for example aluminum, and have expanded surface areas to transfer heat to the environment or may have other mechanical cooling means. When the surface of a heat source, such as an integrated circuit or a module or package containing such components, is directly engaged with the surface of a heat-sinking component, surface irregularities may prevent optimum contact and result in air spaces located in the interface between the surfaces. These air spaces can reduce the rate of heat transfer from the heat source to the heat-sinking component to unacceptable ranges.

A key aspect of efficiently and effectively transferring heat from a heat source to a heat-sinking component, therefore, is maximizing heat transfer between the surfaces. To this end, an interface of thermally conductive material or a component formed from such thermally conductive material can be placed between the heat source and heat sink. Preferably, the material or compound should reduce or eliminate gaps or air spaces that resist heat transfer by maximizing contact with the surfaces of the heat source and heat-sinking components.

One such material that may be used to facilitate heat transfer between a heat source and heat-sinking components is a viscous, thermally conductive paste or grease extending between the contact surfaces of the components. Such pastes or greases function by increasing surface area contact between the heat-dissipating and heat-sinking components. Furthermore, thermally conductive pastes and greases are difficult to apply and messy, and often bond to the surfaces to which they have been applied or may melt and flow under elevated temperatures.

Products have been developed to avoid some of the problems associated with thermally conductive pastes and greases and still facilitate heat transfer through an interface. For example, thermal pads are now made from an elastomeric or foam matrix material loaded with a material that has favorable thermally conductive characteristics. Thermal pads, including those loaded with such materials, are further described in U.S. Pat. Nos. 6,054,198; 5,679,457; 5,545,473; 5,510,174; 5,309,320; 5,298,791; 5,213,868; 5,194,480; 5,137,959; 5,151,777; 5,060,114; 4,979,074; 4,869,954; 4,782,893; 4,685,987; 4,606,962; and 4,602,678. These patents are incorporated herein by reference.

By combining the elastomeric-conforming properties of one material with the favorable thermally conductive properties of another, thermal pads loaded with a thermally conductive material can significantly reduce air spaces and facilitate heat transfer between the surfaces of a heat source and heat-sinking components. Silicone-based materials have come into favor in thermal management materials due to their excellent heat transfer capabilities and their high conformability under compression. Such compression can cause many of these silicone-based materials to effectively flow rather than to simply be compressed, essentially maintaining the original volume of the pad. Especially when used under conditions of continuous elevated temperatures, these silicone-loaded pads have a tendency to exude fluids, for example, silicone and other fluids and may out-gas. These fluids and gases, in turn, may contaminate the IC devices or other components or portions of the equipment. In some applications, this is not a concern, but in many applications, such exudation and/or outgassing is not acceptable.

It is considered by many in the field that thermal pad materials based on or loaded with a non-silicone material are not as effective as other materials in transferring heat and in conformability.

Thus, there is a need for an effective thermal interface component that has the performance characteristics of silicone-based or silicone-loaded thermal pad material but that does not exude silicone or oils under operating conditions.

SUMMARY OF THE INVENTION

In preferred embodiments, a sealed thermal interface component minimizes or eliminates the exudation of fluids, such as silicone oils, while preserving the excellent thermal conductivity of silicon-based thermal pad materials and enhancing the conformability of the component. In preferred embodiments, a foam frame surrounds a plurality of thermal pad portions formed of conformable thermal management material that may exude fluid under elevated temperatures or over time. Film encapsulates the foam-framed thermal pad portions, forming a sealed and partially evacuated thermal interface component. In a preferred embodiment of the invention, the thermal pads are formed of an elastomeric matrix material containing silicone, the foam frame is made of polyurethane, and the film is made of urethane.

In preferred embodiments, in the encapsulation process, air is evacuated from the interior of the encapsulation, thus eliminating of minimizing air gaps or pockets from within the sealed thermal interface component. The encapsulating film is heat sealed around the foam-framed thermal pad portions. The minimal amount of air present in the evacuated component is conducive to excellent thermal transfer characteristics.

Compression of thermal interface management materials between heat source and heat-sinking components generally causes some flowing of the conformable material. This increase in pressure causes the thermal pads to expand along axes perpendicular to the axis of compression. Such compression and the resultant flowage can rupture a simple encapsulation of the material due to the buildup of internal pressure caused by the flowage. The foam frame prevents rupture of the encapsulating film by compressing and allowing lateral expansion by the thermal pads within the component. The invention provides a thermal interface material flow management system.

Another feature and advantage of the preferred embodiments of the invention is the use of a heat-sealed encapsulating film. When heat-sealed, the encapsulating film prevents the exudation of silicone oils, maintains a vacuum within the sealed thermal interface component, enhancing thermal conductivity, and accommodates volumetric displacement of the foam-framed thermal pad without rupture or leakage during compression.

A further feature and advantage of preferred embodiments of this invention is presented relating to the use of foam as a framing component within the sealed thermal interface component. Components formed from a simple encapsulation of conformable heat transfer materials may not adequately contain fluids that may exude from the material, particularly when the component is severely compressed. The foam frame is available for absorbing the silicone oil exuded from the thermal management material in the component. The invention provides a thermal interface material fluid exudation management system through absorption and containment.

Another feature and advantage of the preferred embodiments of this invention is the creation of a vacuum within the encapsulating film while simultaneously heat sealing the encapsulating film. This removes and maintains the absence of air spaces from the sealed thermal interface. Air may inhibit heat transfer and the vacuum-induced lack of air within the thermal interface component increases the thermal transfer performance.

Another feature and advantage of the preferred embodiments of the invention is the presence of a control means for silicone oil in the thermal interface. Said means comprises a containment for the oil as well as an liquid-absorbing capability within the thermal interface.

DETAILED DESCRIPTION OF PREFERRED EMBODIMENTS

The present invention includes a heat-sealed thermal interface component for facilitating heat transfer between a heat source and a heat-sinking component. Referring to FIGS. 1, 2, 5, and 6 different embodiments of the sealed thermal interface component 20, 21 are illustrated. The components generally have a top side 21.1 with a top surface 21.2, a bottom side 21.3 with a bottom surface 21.4, and a side 21.5 with a side surface 21.6. In preferred embodiments the component is a sheet configuration with a maximum thickness of about 0.03 inches to about 0.50 inches (in the z direction of the x-y-z coordinate system) and surface area (in the x and y plane) of about 2 square inches to about 36 square inches. More preferably, the component has a thickness of 0.06 to 0.16 inches. The component may have a thickness that varies slightly due to different thicknesses of the base components and compression that occurs during manufacture, specifically the partial evacuation. When used herein partial evacuation indicates that the component was sealed with the interior of the encapsulation at a negative pressure, that is below the atmospheric pressure at the time and point of encapsulation.

Referring to FIGS. 2-4, 6-7, and 11-12, detailed cross-sectional views of sealed thermal interface components are illustrated. Sealed thermal interface components 20, 21 are principally made up of foam frame 24, thermal pads 22, upper film 26, and lower film 28.

Sealed thermal interface components 20 comprise thermal pads 22 situated inside frames 24, preferably foam frames. Foam frames 24 and thermal pads 22 are sealed between an upper films 26 and a lower films 28. The films 26, 28 are preferably transparent and encapsulated 29 or form an uninterrupted barrier around foam frame 24 and thermal pads 22.

Figures 3, 4:
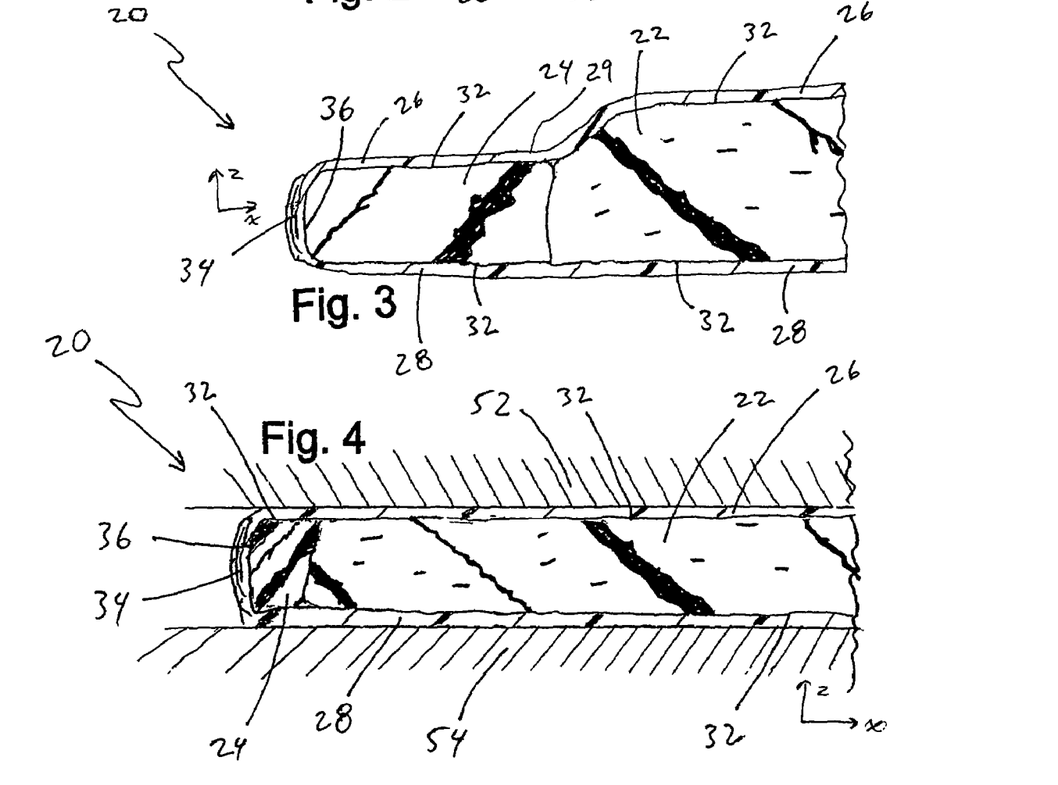
FIG. 3 is a cross-sectional view of the sealed thermal interface component of FIGS. 1 and 2.
FIG. 4 is an enhanced cross-sectional view of the sealed thermal interface component shown in FIG. 1 compressed between a heat source and a heat-sinking component.
Figure 7:
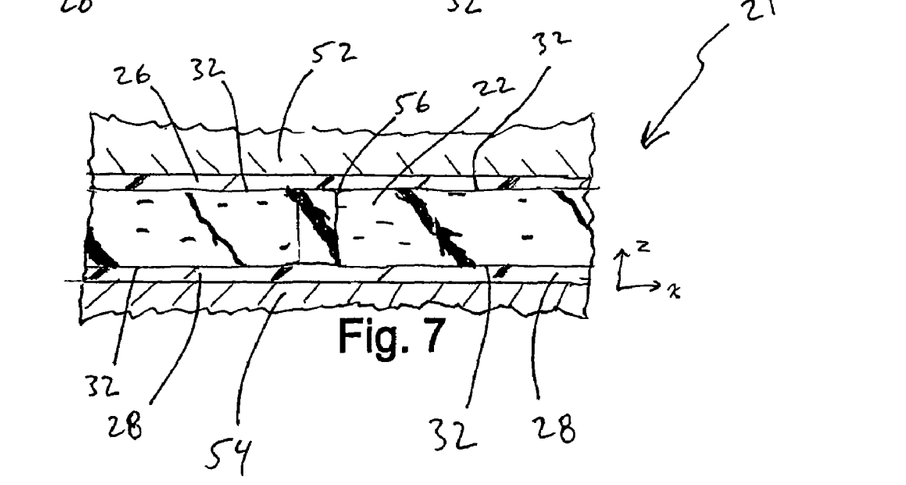
FIG. 7 is a cross-sectional view of the sealed thermal interface component shown in FIG. 6 compressed between a heat source a heat-sinking component.

Thermal pad 22 is made from a compressible and conformable thermal management material suitable for transferring heat from an integrated circuit (IC) device to a cooling block. In one embodiment, the thermal management material is an elastomeric matrix loaded with silicone, metal composites, or other thermally conductive material. The thermal conductivity of thermal pad 22 is typically in a range of about 0.04 watts per meter per degree Kelvin ("w/m-K") to 20.0 w/m-K, or more preferably a range of about 0.4 w/m-K to about 5.0 w/m-K, or about 0.74 w/m-K to about 2.3 w/m-K. The thermal resistance of thermal pad 22 is preferably in a range of about 50 degrees Celsius by square millimeters per watt ("C-mm$^2$/w") to about 200 C-mm$^2$/w, or more preferably about 80 C-mm$^2$/w to about 190 C-mm$^2$/w. The dielectric breakdown strength of thermal pad 22 is preferably in a range of about 100 volts per millimeter (V/m) to about 1000 V/m, or more preferably a range of about 523 V/m to about 882 V/m. The Shore A hardness is preferably in a range of about 10 to about 200, or more preferably about 70 to about 100. A preferred material for the thermal pads is Thermagon T-flex 6100, manufactured by Laird (Cleveland, Ohio). Other materials with similar characteristics may also be used. Also Gap Pad® and Gap Filler® materials available from The Bergquist Company of Chanhassen, Minn. are believed to be suitable. These materials are typically silicon based As shown in FIGS. 4 and 7, sealed thermal interface component 20 may be compressed between heat source 56 and heat-sinking component 54. Compression of thermal pad 22 between heat source 56 and heat-sinking component 54 alters the shape and may change the volume of the components 20, 21 and of the thermal pads 22, causing flowage of thermal pad 22 material. The thickness of foam frame 24 is preferably less than the thickness of thermal pads 22. This optimizes the ability of foam frame 24 to accommodate expansion of thermal pads 22 without rupturing films 26, 28 during compression. The thickness of thermal pads 22 is preferably in a range of about 0.03 inches (in.) to about 0.50 in., or more preferably about 0.06 in. to about 0.016 in. In more preferred embodiments, the thickness of thermal pads 22 is about 0.10 in. thick and the thickness of foam frame 24 is about 0.045 in. thick.

Figure 1:
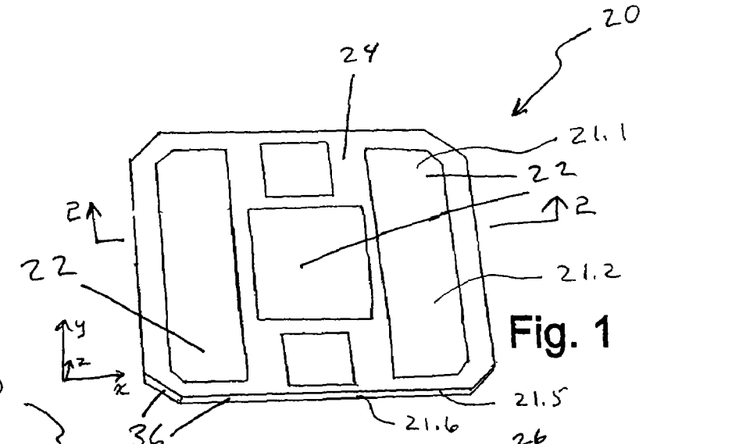
FIG. 1 is a perspective view of a thermal interface component according to the invention.
Figure 5:
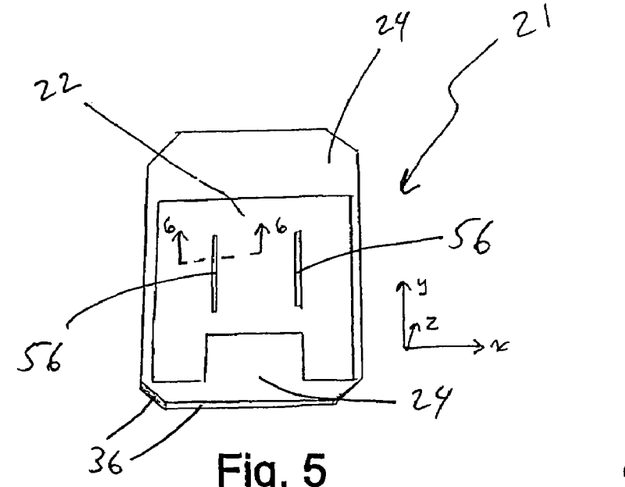
FIG. 5 a perspective view of a thermal interface component according to the invention.
Figure 6:
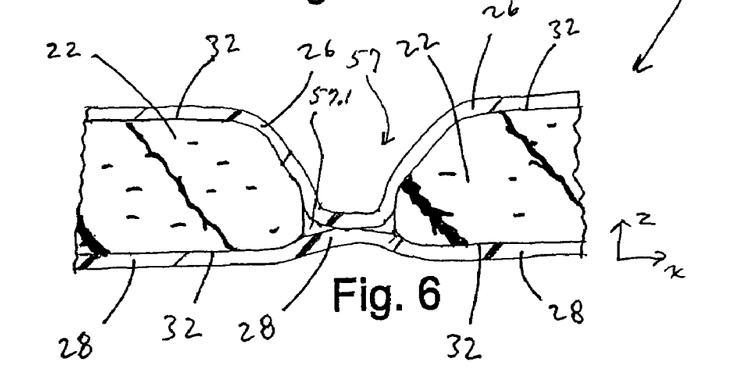
FIG. 6 is a cross-sectional view of the sealed thermal interface component of FIG. 5 taken at line 6-6.

Thermal pads 22 may be of any suitable and the corresponding cooperating frame 24 any suitable complementary shape. In one embodiment, thermal pads 22 are substantially square in shape, as shown in FIG. 1. In another embodiment, thermal pads 22 may be shaped to substantially match the shape of a particular heat source 56. In another embodiment, thermal pads 22 contain an aperture or are slotted to provide volume-absorbing gaps 57 laterally (in the x-y plane)

between for expansion due to compression of thermal pads 22, as shown in FIGS. 5 and 6.

Thermal pads 22 may be spaced in any suitable configuration. In one embodiment, thermal pads 22 are spaced substantially evenly in foam frame 24, as shown in FIG. 1. In another embodiment, thermal pads 22 may be spaced and configured to align with specific heat sources 56, as shown in FIG. 5.

Figure 2:
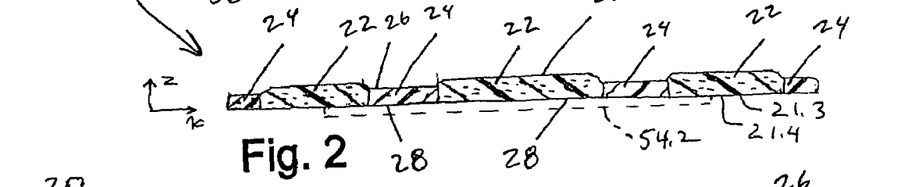
FIG. 2 is a cross-sectional view of the sealed thermal interface component of FIG. 1 taken at line 2-2.

During compression, normally in the z direction, thermal pad 22 expands outward along axes perpendicular to the axis of compression, that is the x and y directions, as shown in FIGS. 4 and 7. As shown in FIG. 4, foam frame 24 may contract near edge 36 of the component to accommodate expansion of thermal pads 22. In one embodiment, lateral expansion of thermal pads 22 is accommodated by placing thermal pads 22 in foam frame 24 shaped like a window grille, as shown in FIGS. 1 and 2. In another embodiment, lateral expansion of thermal pads 22 is accommodated by removing material from thermal pads 22 to create volume-absorbing gaps 57 prior to encapsulation. As shown in FIG. 7, thermal pads 22 expand into volume-absorbing gaps 57 during compression and may cause expansion of the region 57.1 between the upper and lower films. There may also be the closed but unsealed two layers of film at the edges of the component that allows the thermal pad to push beyond the previous perimeter or edge of the component. For example in FIG. 11, the end 58.1 of the overlapping layers of film may be sealed but the adjacent portion 58.2 not sealed to allow the thermal pad to expand therein.

During compression of sealed thermal interface 20, thermal pads 22 may exude fluid that was loaded into or that is part of thermal pads 22 to facilitate heat transfer. Thermal pads 22 comprising a filled silicone elastomer, for example, may exude silicone fluids. Surrounding thermal pads 22 and foam frame 24 with upper film 26 and lower film 28 sealed at overlapping juncture 34 may absorb and contain silicone fluids and other potential contaminants within sealed thermal interface component 20.

The encapsulation formed by upper film 26 and lower film 28 completely surrounds and seals therein thermal pads 22 and foam frame 24. In preferred embodiments, interfaces 32 between films 26, 28 and foam frame 24 and between films 26, 28 and thermal pad 22 are substantially free of air spaces. Films 26, 28 are substantially coextensive with the surface of thermal pads 22 and foam frame 24.

Figures 10, 11, 12:
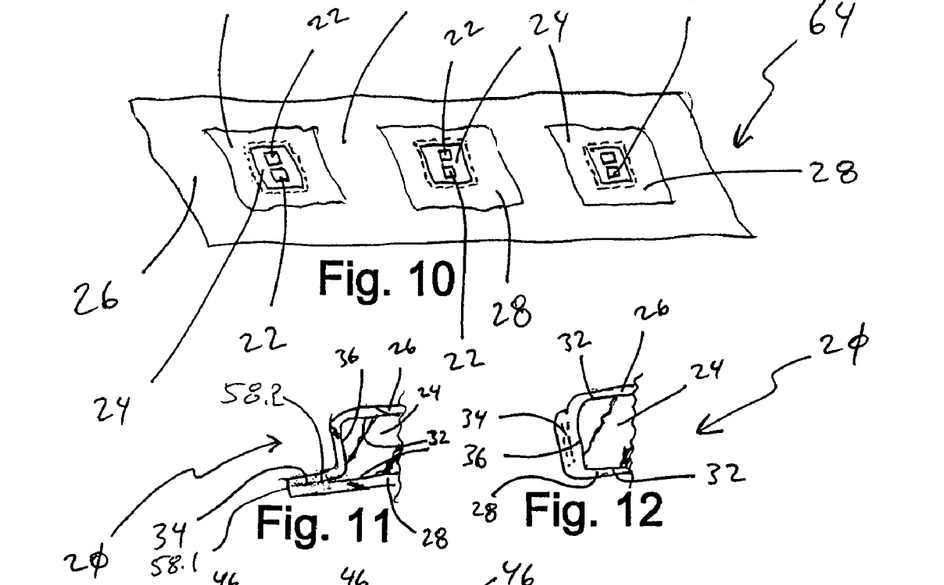
FIG. 10 is a perspective view of framed thermal interface pads components sealed between two layers of film.
FIG. 11 is a cross-sectional view of the overlapping juncture of the heat-sealed upper and lower layers of film around the outer edge of the foam frame after having been trimmed.
FIG. 12 is a cross-sectional view of the thermal interface component of FIG. 11 after the loose edges are heat sealed to the side of the component overlapping juncture of the heat-sealed upper and lower layers of film after they have been folded so as to conform to the edge of the foam frame.

Upper film 26 and lower film 28 are integrally joined or otherwise hermetically sealed at overlapping juncture 34. In one embodiment, overlapping junction 34 follows the circumference of foam frame 24 substantially coextensive with outer edge 36 of foam frame 24. Overlapping junction 34 may be folded upon itself to lie coextensive with upper film 26 or lower film 28, as shown in FIG. 12 thereby providing further reinforcement to the juncture 34.

Films 26, 28 are suitably polyurethane. Films 26, 28 may be deformed, and are suitably elastic. When sealed thermal interface component 20 is compressed, such as, for example, between an integrated circuit (IC) device and a cooling block, films 26, 28 accommodate volumetric expansion of thermal pads 22 without rupturing. As shown in FIGS. 3, 4, 6, and 7, the thickness of upper film 26 is substantially the same as the thickness of lower film 28. The thickness of films 26, 28 is preferably in a range of about 0.5 thousandths of an inch (mil) to about 3.0 mils, or more preferably about 1.0 mils to about 2.0 mils. In a most preferred embodiment, the thickness of films 26, 28 is about 1.4 mils. A preferred film is Duraflex X1843, manufactured by Deerfield Urethane (South Deerfield, Mass.). Use of such films and such relatively thin films provide minimal additional heat transfer resistance to the component.

In operation, sealed thermal interface component 20 facilitates heat transfer. As shown in FIGS. 4 and 7, sealed thermal interface component 20 is compressed between heat source 52 and heat-sinking component 54 to achieve coextensive thermal communication between sealed thermal interface component 20 and adjacent surfaces of heat source 52 and heat-sinking component 54. Heat source 52 generates heat, which is transferred through sealed thermal interface component 20 to heat-sinking component 54. In preferred embodiments, heat source 52 may be an integrated IC device and heat-sinking component 54 may be a cooling block. Referring to FIG. 2, a pressure sensitive pad 54.2 may be applied to the component to facilitate attachment to the heat generating component or heat sink.

In manufacturing sealed thermal interface component 20, thermal pads 22 are cut from a sheet of thermal management material. In one embodiment of this method, thermal pads 22 are cut using a waterjet apparatus. Use of a waterjet apparatus minimizes deformation of thermal management material during the cutting process. In another embodiment of this method, thermal pads 22 are cut using a die-cutting apparatus. Typically, there are layers of backing on the thermal management material that is preferably removed before encapsulating.

In manufacturing sealed thermal interface component 20, foam frame 24 is cut from a sheet of foam material. This process includes cutting the outer shape and dimensions of foam frame 24 as well as apertures in foam frame 24 that will accept thermal pads 22. In preferred embodiments of this method, foam frame 24 is cut using a water-jet apparatus. In another embodiment of this method, foam frame 24 is cut using a die-cutting apparatus. A preferred foam is Poron 4701-30, manufactured by Rogers Corporation (Woodstock, Conn.). The foam frames have a inner geometry, such as the windows 25.5, and an outer geometry 25.6. The thermal pads are sized for insertion in the inner geometry.

In manufacturing sealed thermal interface component 20, thermal pads 22 are placed in apertures in foam frame 24. In preferred embodiments of this method, thermal pads 22 are placed by hand in apertures cut in foam frame 24. Inserting thermal pads 22 by hand into apertures in foam frame 24 minimizes deformation of thermal management material 36. In another embodiment of this method, thermal pads 22 are placed into apertures in foam frame 24 by a machine.

In manufacturing sealed thermal interface component 20, upper film 26 and lower film 28 are cut from roll of film. In preferred embodiments, lower film portions 28 are cut so as to be narrower and shorter than upper film 28, as shown in FIGS. 8-10.

Figure 8:
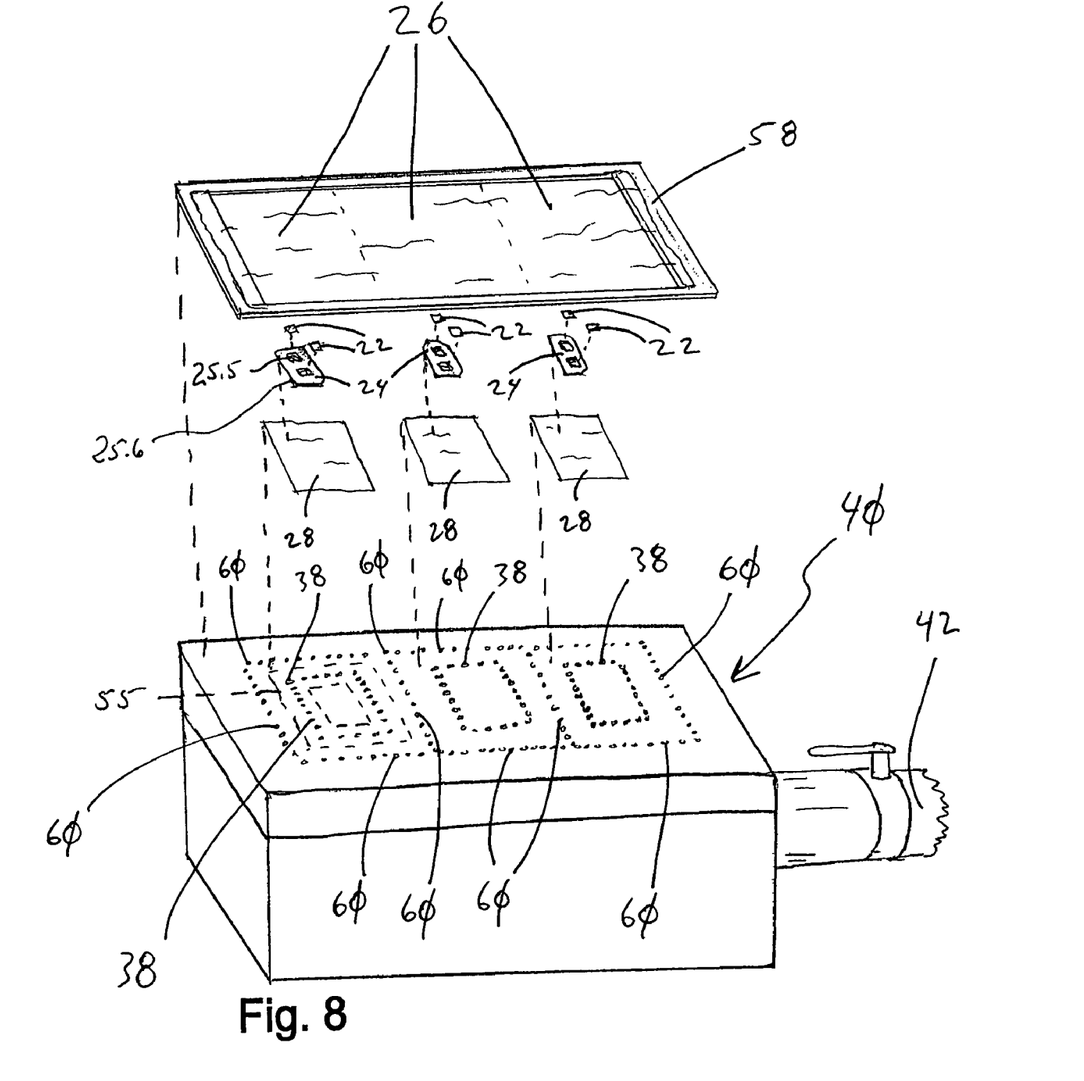
FIG. 8 is a perspective view of the apparatus and process used to encapsulate the thermal interface pad between two layers of film and remove air spaces from the encapsulation.
Figure 9:
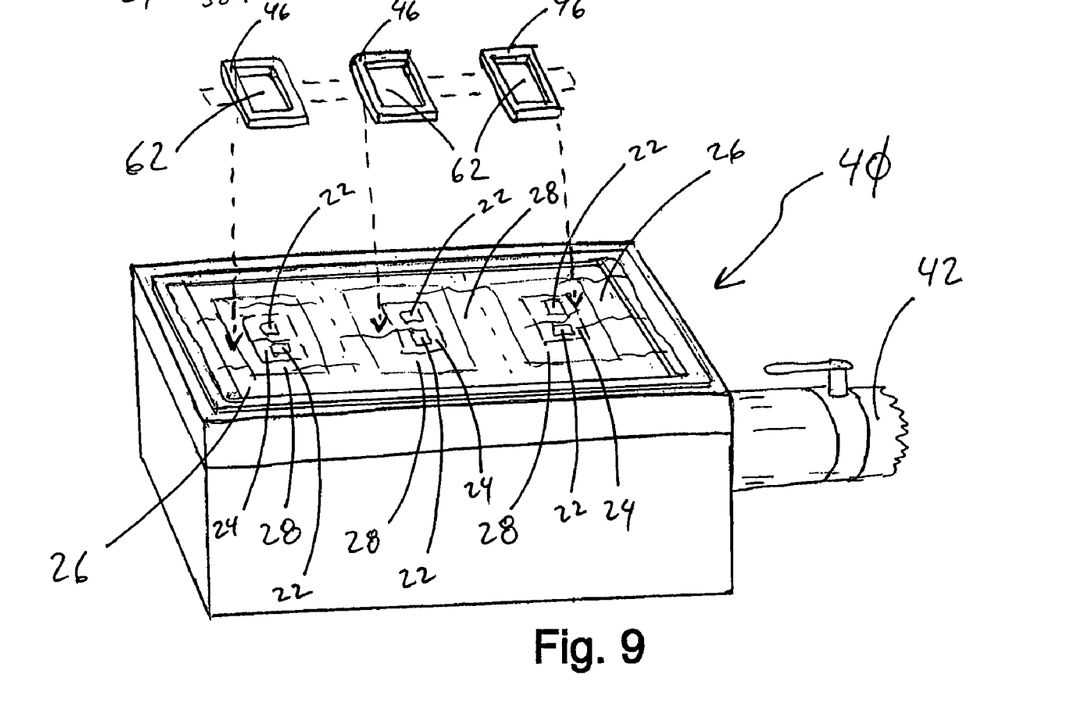
FIG. 9 is a perspective view of the apparatus and process used to heat-seal the framed thermal interface pads between two layers of film.

In manufacturing sealed thermal interface component 20, lower film 28 is placed onto vacuum table 40 connected to vacuum hose 42, as shown in FIG. 8. Foam frame 24 and thermal pads 22 are placed onto lower film 28, as shown in FIG. 8. In preferred embodiments, foam frame 24 already containing thermal pads 22 is placed onto lower portions film 28. In another embodiment, thermal pads 22 are placed onto foam frame 24 and onto lower film 28 after foam frame 24 is placed onto lower film 28. In another embodiment, foam frame is placed around thermal pads 22 and onto lower film 28 after thermal pads 22 are placed onto lower film 28. In preferred embodiments, a plurality of foam frames 24 containing thermal pads 22 are placed over lower film 28. In another embodiment, single foam frame 24 containing thermal pads 22 is placed over foam frame 24 containing thermal pads 22.

In manufacturing sealed thermal interface component 20, upper film 26 is adhered to rigid frame 58. Rigid frame 58 is lowered and upper film 26 is thereby placed over foam frame 24 containing thermal pads 22 and over lower film 28. In preferred embodiments, upper film 26 is placed over a plurality of foam frames 24 containing thermal pads 22.

In manufacturing sealed thermal interface component 20, the internal pressure of vacuum table 40 becomes lower than the ambient pressure when the vacuum is engaged. This pressure differential creates a negative force through an array of inner holes 38 and outer holes 60 in the top surface of vacuum table 40. As shown in FIG. 8, when lower film 28 is placed on vacuum table 40, the outer edge of lower film 28 is located between inner holes 38 and outer holes 60 at the position 58 defined by the dashed lines. The negative force through the array of inner holes 38 holds lower film 26 in place on vacuum table 40. At this point, air continues to pass through outer holes 60, but no longer passes through inner holes 28. When upper film 26 is placed over foam frame 24 containing thermal pads 22, the outer edge of upper film 26 lies outside the array of outer holes 60. As this point, all holes 38, 60 are substantially covered and air no longer passes through holes 38, 60. The negative force through the array of outer holes 60 holds upper film 60 in place over foam frame 24 containing thermal pads 22 and over lower film 28. Since upper film 26 is wider and longer than lower film 28, vacuum table 40 holds upper film 26 in place over lower film 28 coextensively along overlapping juncture 34. In preferred embodiments, upper film 26 is placed over a plurality of foam frames 24 containing thermal pads 22. In another embodiment, upper film 28 is placed over a single foam frame 24 containing thermal pads 22.

In manufacturing sealed thermal interface component 20, air spaces are removed from overlapping juncture 34 between upper film 26 and lower film 28 so that films 26, 28 are substantially coextensive with thermal pads 22 and foam frame 24. Air spaces are also substantially removed from between upper film 26 and lower film 28 at overlapping juncture 34. When necessary due to the geometry of thermal pads 22, air is also removed from gaps 57. In preferred embodiments, air spaces are removed by exerting downward pressure on the upper film 26 and foam frame 24 containing thermal pads 22.

In manufacturing sealed thermal interface component 20, overlapping juncture 34 is sealed. In preferred embodiments of this method, overlapping juncture 34 is heat sealed. As shown in FIG. 9, heated sealing walls 46 are adapted to form cavities 62 that fit over and around foam frames 24 containing thermal pads 22. The height of cavities 62 is slightly larger than the height of thermal pads 22. The shape of cavities 62 is substantially the same and slightly larger than the outer shape of foam frames 24 such that sealing walls 46 conform to foam frames 24 containing thermal pads 22. In preferred embodiments, heated sealing walls 46 are affixed onto a movable heating press. The movable heating press is lowered such that each cavity 62 surrounds foam frame 24 containing thermal pads 22. Films 26, 28 are pinched between contact surfaces of heated sealing walls 46 and vacuum table 40. Movable heating press is raised after overlapping juncture 34 has been sufficiently sealed. In other embodiments, overlapping juncture 34 is sealed by alternative means, such as, for example, by application of an adhesive. In preferred embodiments, a package 64 of several foam frames 24 containing thermal pads 22 are independently sealed between upper film 26 and lower film 28. In another, embodiment, a single foam frame 24 containing thermal pads 22 is sealed between upper film 26 and lower film 28.

In manufacturing sealed thermal interface component 20, excess upper film 26 and excess lower film 28 are removed. As shown in FIG. 11, a discrete portion of heat-sealed films 26, 28 remains around outer edge 36 of foam frame 24. In preferred embodiments of this method, excess upper film 26 and excess lower film 28 are removed by a die-cutting apparatus. As shown in FIG. 12, the portion of heat-sealed films 26, 28 forming overlapping junction 34 that remains after excess upper film 26 and excess lower film 28 are removed is folded over sealed thermal interface 20 and sealed with heat and pressure.

The embodiments above are intended to be illustrative and not limiting. Additional embodiments are within the claims. Although the present invention has been described with reference to particular embodiments, workers skilled in the art will recognize that changes may be made in form and detail without departing from the spirit and scope of the invention.

Some embodiments of the invention may include a simple encapsulation of the thermal pads without the foam framing or utilizing another framing material such as rigid of soft polymers.

What is claimed is:

1. A method of assembling a sealed thermal interface comprising the steps of:
    inserting a thermal pad having a top surface and a bottom surface with an outer periphery extending around the thermal pad between the top surface and the bottom surface inside an aperture in a foam frame such that the foam frame surrounds the outer periphery of the thermal pad while leaving the top surface and the bottom surface substantially exposed to facilitate heat transfer through the thermal pad, the thermal pad containing an elastomeric matrix loaded with a thermally conductive material;
    placing the foam frame and the thermal pad between a lower film and an upper film;
    removing air spaces between the lower film and the upper film; and
    sealing the lower film and the upper film around the thermal pad and the foam frame, the lower film and the upper film being substantially impermeable to the thermally conductive material.

2. The method of claim 1, further comprising the steps of:
    cutting the thermal pad of a desired geometry; and
    cutting the foam frame of a desired geometry.

3. The method of claim 1, wherein the step of removing air spaces between the lower film and the upper film comprises the step of substantially creating a vacuum between the upper film and the lower film.

4. The method of claim 1, wherein the step of sealing the lower film and the upper film around the thermal pad and the foam frame comprises the step of heat sealing the lower film to the upper film.

5. The method of claim 1, further comprising the step of:
    adhering an adhesive adapted to adhere the sealed thermal interface to a heat sink.

* * * * *

UNITED STATES PATENT AND TRADEMARK OFFICE
CERTIFICATE OF CORRECTION

PATENT NO. : 7,954,236 B2
APPLICATION NO. : 11/704005
DATED : June 7, 2011
INVENTOR(S) : Timothy J. Lundell and Thomas L. Lundell It is certified that error appears in the above-identified patent and that said Letters Patent is hereby corrected as shown below:

- Title Page 2, item 56, Other Publications, line 18, right column, 6th reference from the top. "Core" should be 'Gore'.

- Title Page 2, item 56, Other Publications, line 29, right column, 9th reference from the top. "http://ww.lairdtech" should be 'http://www.lairdtech'.

- Col. 3, line 15, "as well as an liquid-absorbing" should be 'as well as a liquid-absorbing'.

- Col. 3, line 29, "FIG. 5 a perspective view" should be 'FIG. 5 is a perspective view'.

- Col. 3, line 43, "interface pads components sealed" should be 'interface pads' components sealed'.

- Col. 4, line 17, "sealed between an upper films 26 and a lower films 28" should be 'sealed between upper films 26 and lower films 28'.

- Col. 5, line 13, "In one embodiment, "lateral" should be 'In one embodiment, lateral'.

Signed and Sealed this
Twenty-ninth Day of November, 2011

David J. Kappos
*Director of the United States Patent and Trademark Office*